(12) United States Patent
Saputra et al.

(10) Patent No.: US 12,418,283 B2
(45) Date of Patent: Sep. 16, 2025

(54) PROGRAMMABLE SELF-BIASING INVERTER FOR CORRECTING DUTY CYCLE DISTORTION

(71) Applicant: QUALCOMM Incorporated, San Diego, CA (US)

(72) Inventors: Nitz Saputra, San Diego, CA (US); Sameer Wadhwa, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 63 days.

(21) Appl. No.: 18/391,096

(22) Filed: Dec. 20, 2023

(65) Prior Publication Data
US 2025/0211218 A1    Jun. 26, 2025

(51) Int. Cl.
*H03K 5/156*        (2006.01)
(52) U.S. Cl.
CPC .................... *H03K 5/1565* (2013.01)

(58) Field of Classification Search
None
See application file for complete search history.

(56) References Cited

U.S. PATENT DOCUMENTS

| | | | |
|---|---|---|---|
| 8,653,856 B2* | 2/2014 | Piepenstock ... | H03K 19/018528 327/108 |
| 2012/0081179 A1* | 4/2012 | Visser ............ | H03F 1/02 330/251 |
| 2022/0209716 A1* | 6/2022 | Yamamoto ...... | H03B 5/368 |

* cited by examiner

*Primary Examiner* — Cassandra F Cox
(74) *Attorney, Agent, or Firm* — Loza & Loza, LLP

(57) ABSTRACT

A clock conditioning circuit includes a duty cycle correction circuit. The duty cycle correction circuit has a first input capacitor, a first self-biasing inverter and a variable capacitor. The first self-biasing inverter has an input coupled to the first input capacitor. The variable capacitor may be coupled to the first input capacitor. The variable capacitor may be configured to receive a first clock signal. A capacitance of the variable capacitor may be programmable by a capacitance control signal.

19 Claims, 8 Drawing Sheets

PROGRAMMABLE SELF-BIASING INVERTER FOR CORRECTING DUTY CYCLE DISTORTION

TECHNICAL FIELD

The present disclosure generally relates to a clock generation circuit and, more particularly, to circuitry for conditioning clock signals used by a serializer.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others.

IC devices may include a serializer/deserializer (SERDES) to transmit and receive through a communication link. In high-speed applications, timing of the operation of a SERDES may be controlled by multiple clock signals. The use of multiple increased frequency clock signals results in increased power consumption. Furthermore, the SERDES generally operates using clock signals that have the same frequency but different phases. Performance, accuracy or reliability of the SERDES may depend on frequency and the phase relationships of the clock signals and drift or other variations in the phase relationships of clock signals can result in errors in received or transmitted data. Therefore, there is an ongoing need improve, low-power clock generation and clock conditioning circuits for use in interfaces that employ SERDES circuits.

SUMMARY

Certain aspects of the disclosure relate to IC devices that include a bus interface. The bus interface may include circuits that can be configured to condition clock signals to ensure accurate and reliable control of transmissions over a communication bus or for accurate and reliable capture of data from signals transmitted over the communication bus.

In various aspects of the disclosure, a clock conditioning circuit includes a duty cycle correction circuit, that includes a first input capacitor and a first self-biasing inverter that has an input coupled to the first input capacitor. The clock conditioning circuit includes a variable capacitor coupled to the first input capacitor. The variable capacitor is configured to receive a first clock signal. A capacitance of the variable capacitor is programmable by a capacitance control signal.

In various aspects of the disclosure, a method for conditioning clock signals includes providing a first clock signal to an input of a duty cycle correction circuit, the duty cycle correction circuit having a first self-biasing inverter and a first input capacitor, and selecting a capacitance value provided by a variable capacitor that is coupled to the first input capacitor. A capacitance provided by the variable capacitor may be programmable by a capacitance control signal.

In various aspects of the disclosure, an apparatus includes means for correcting a duty cycle of a clock signal, including a first self-biasing inverter and a first input capacitor. The apparatus includes means for adjusting transition times of edges in the clock signal, including a variable capacitor that is coupled to the first input capacitor. The apparatus includes means for programming a capacitance value provided by a variable capacitor. The means for programming the capacitance value may be responsive to a capacitance control signal.

In certain aspects, the clock conditioning circuit includes a second input capacitor, and a second self-biasing inverter. The second self-biasing inverter has an input coupled to the second clock signal through the second input capacitor. The variable capacitor is coupled between the first clock signal and the second clock signal. The clock conditioning circuit may include an input circuit configured to receive a single-ended input clock signal and to convert the single-ended input clock signal to a differential clock signal. The differential clock signal includes the first clock signal and the second clock signal. A skew correction circuit may be provided between the first clock signal and the second clock signal and may include at least one pair of back-to-back inverters. The variable capacitor may include a plurality of switches controlled by the capacitance control signal. Each switch may be configured to couple the first clock signal and the second clock signal through a corresponding pair of series connected differential capacitors when activated.

In one aspect, the capacitance control signal is a multi-bit unary or binary encoded signal. In one aspect, the first self-biasing inverter includes a feedback resistor coupled between the input of the first self-biasing inverter and an output of the first self-biasing inverter.

In certain aspects, the clock conditioning circuit includes a configurable inverter configured to provide the first clock signal by delaying an input clock signal. In this configuration, the variable capacitor may be coupled between the first clock signal and ground. The variable capacitor may include a plurality of switches controlled by the capacitance control signal. Each switch may be configured to couple the first clock signal to ground through one of a plurality of capacitors provided in the variable capacitor when the each switch is activated.

DETAILED DESCRIPTION

Figure 1:
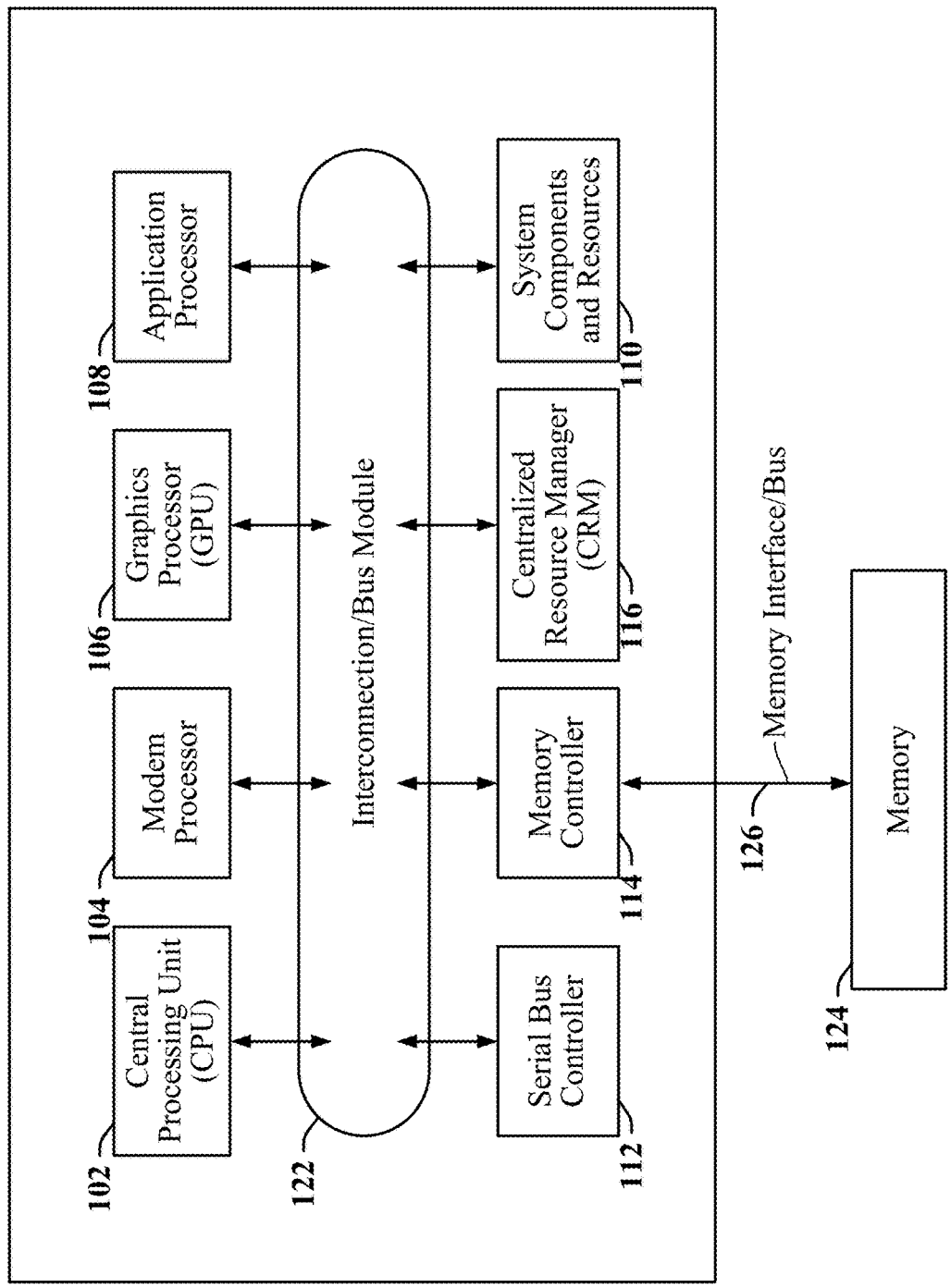
FIG. 1 illustrates an example of a system-on-a-chip in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Data communication links employed by SoCs and other IC devices to connect processors with modems and other peripherals may be operated in accordance with industry or proprietary standards or protocols associated with certain functions or types of devices. According to certain aspects of the disclosure, a serial data link may be used to interconnect electronic devices that are subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, or any other similar functioning device.

Certain aspects of the disclosure are applicable to a wide variety of input/out (I/O) circuits. In one example, certain aspects of this disclosure may be implemented in I/O circuits that provide an interface between core circuits and memory devices. Many mobile devices employ Synchronous Dynamic Random Access Memory (SDRAM), including Low-Power Double Data Rate SDRAM, which may be referred to as low-power DDR SDRAM, LPDDR SDRAM or, in some instances, LPDDRx where x describes the technology generation of the LPDDR SDRAM. Later generations of LPDDR SDRAM designed to operate at higher operating frequencies may employ lower voltage levels in the core of an SoC or memory device to mitigate for increased power associated with the higher operating frequencies.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

Certain examples of circuits used to generate, process or condition clock signals are disclosed herein. Certain of these circuits are illustrated as being implemented using certain combinations of P-type metal-oxide-semiconductor (PMOS) transistors and N-type metal-oxide-semiconductor (NMOS) transistors. These circuits are provided by way of example only, and it is contemplated that the concepts disclosed herein can be implemented in circuits that use different combinations of NMOS and PMOS transistors. Circuits that include NMOS and PMOS transistors are typically coupled to the rails of a power supply. The power supply provides a current that flows from a higher voltage rail to a lower voltage rail. A rail may include some combination of conductors, wires, connectors and other types of interconnect. For the purposes of this description, the higher voltage rail may be referenced as "VDD" or "$V_{DD}$," and the lower voltage rail may be referred to as Ground. In some implementations, power may be provided to certain circuits through more than two rails.

For the purposes of this disclosure, a half-rate clock signal used to control operation of SERDES circuits has a frequency that is half the frequency of the data signal. The term quarter-rate as used herein refers to the use of a multiphase clock signal with a frequency that is a quarter of the frequency of the data signal. In-phase signal and quadrature versions of a quarter-rate clock signal may be used in certain SERDES circuits. The quadrature version of the clock signal is phase-shifted with respect to the in-phase version of the clock signal by 90°.

FIG. 1 illustrates an example of an apparatus 100 in which certain components and interconnections are implemented in an SoC. The SoC may include or be coupled to a memory interface/bus 126 that can be adapted according to certain aspects of the present disclosure. The apparatus 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The apparatus 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The apparatus 100 may further include a serial bus controller 112 such as a Universal Serial Bus (USB) controller, one or more memory controllers 114, and a centralized resource manager (CRM) 116. The apparatus 100 may also include an input/output module (not illustrated) for communicating with resources external to the SoC, each of which may be shared by two or more of the internal SoC components.

The processors 102, 104, 106, 108 may be interconnected to the serial bus controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high-performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via the memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the apparatus 100.

Figure 2:
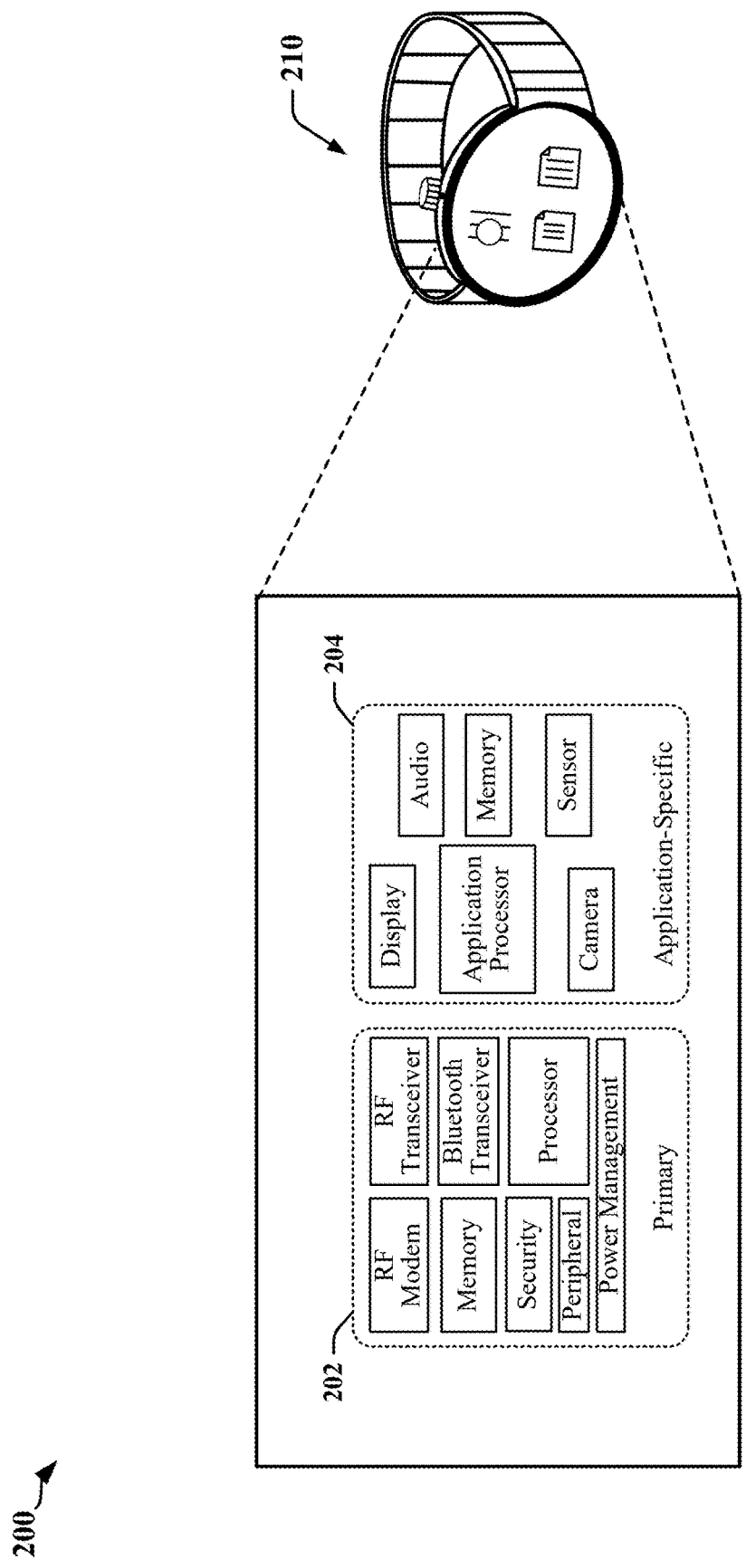
FIG. 2 illustrates an apparatus employing interconnected chiplets.

FIG. 2 illustrates an example of an apparatus 200 in which certain components are implemented using multiple chiplets that are interconnected using one or more data communication buses. In one example, the apparatus 200 may be enclosed within a wearable device a portable or wearable processing and/or communication device (each of which being referred to herein as a portable communication device or PCD), sensors, instruments, appliances and other such devices include one or more ICs. These devices may include mobile phones, tablet computers, palmtop computers, portable digital assistants (PDAs), portable game consoles, and other portable electronic devices such as the illustrated smartwatch 210. PCDs commonly contain integrated circuits or SoCs that include numerous components or subsystems designed to work together to deliver functionality to a user. The various SoC subsystems may communicate with each other via one or more intra-chip data buses or similar data communication interconnects. PCDs may have multiple SoCs that communicate with each other via similar inter-chip interconnects. The ICs are typically packaged in an IC package, which may be referred to as a "semiconductor package" or "chip package." The IC package typically includes a package substrate and one or more IC chips or other electronic modules mounted to the package substrate to provide electrical connectivity to the IC chips. For example, an IC chip in an IC package may be configured as an SoC. The IC chips are electrically coupled to other IC chips and/or to other components in the IC package through electrical coupling to metal lines in the package substrate. The IC chips can also be electrically coupled to other circuits outside the IC package through electrical connections of external metal interconnects (e.g., solder bumps) of the IC package.

Chiplet technology can be used to address some of the performance, power and size design requirements for complex SoCs used in certain mobile or wearable devices. The block diagram in FIG. 2 illustrates certain aspects of an apparatus 200 that can be constructed using chiplets. The apparatus 200 may be configured by selecting a combination of chiplets that implement certain subsystems or distinct functional elements. In the illustrated example, the apparatus 200 includes a set of primary chiplets 202 that enable the apparatus 200 to perform core processing, security and communication functions. The set of primary chiplets 202 include a processor, memory and one or more modems. The illustrated apparatus 200 also includes a set of application-specific chiplets 204 that includes an application processor, display driver, camera interface and audio controller. In a remote sensing device or appliance, the audio-visual components could be omitted and may be replaced with analog-to-digital controllers, for example.

The apparatus 200 may include a variety of processing engines, such as central processing units (CPUs) with multiple cores, graphical processing units (GPUs), digital signal processors (DSPs), neural processing units (NPUs), wireless transceiver units (also referred to as modems), peripherals, display and imaging interfaces, etc. Each of these subsystems and other functional elements can be implemented as an individual chiplet, or as a combination of chiplets. The chiplets included in the apparatus 200 can be proprietary or may be acquired from a variety of sources. An SoC may be constructed from chiplets manufactured at different process nodes and/or operated at different voltages.

Figure 3:
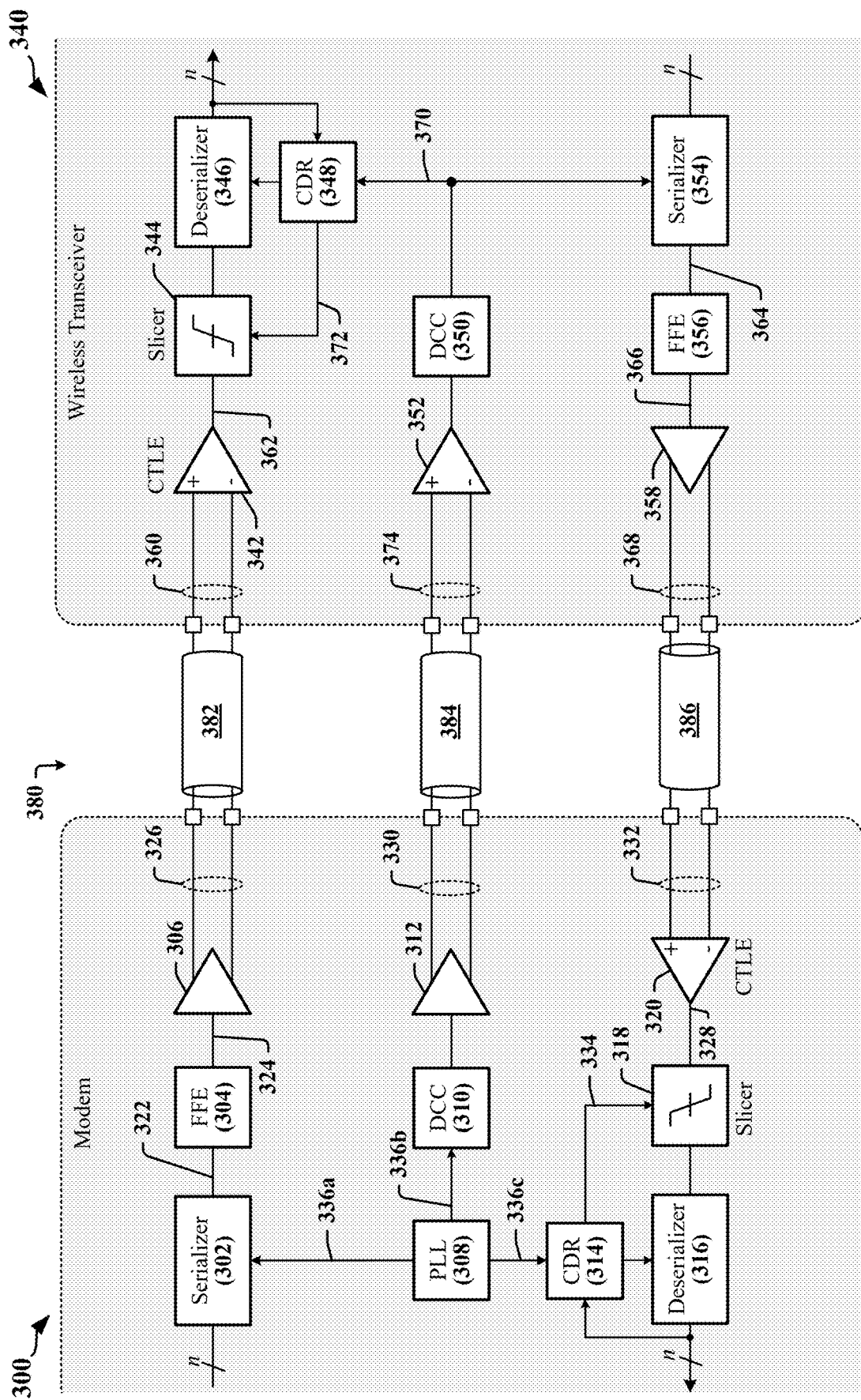
FIG. 3 illustrates an example of a system that employs a multi-channel data communication link.

FIG. 3 illustrates an example of a system that employs a multi-channel data communication link 380 to couple a modem 300 with a wireless transceiver 340. The data communication link 380 includes data channels 382 and 386 and a clock channel 384 that provide a transmission medium through which signals propagate between devices. In the illustrated example, a modem 300 transmits data in a first signal over a first data channel 382 to a wireless transceiver 340 and receives data in a second signal transmitted over a second data channel 386. Data signals are transmitted over the data channels 382 and 386 in accordance with timing information provided by a bus clock signal 330 transmitted over the clock channel 384.

The modem 300 may include a serializer 302 configured to convert n-bit parallel data elements, bytes or words into a serial data stream for transmission in a transmit data signal 322 over the first data channel 382. The transmit data signal 322 may be preconditioned by a pre-equalizing circuit, such as the illustrated digital feed-forward equalizer (the FFE 304), in order to combat or compensate for signal distortions attributable to inter-symbol interference (ISI), reflection and other effects that can be expected to limit bandwidth in first data channel 382. The preconditioned transmit data signal 324 output by the FFE 304 is provided to a driver circuit 306 that is configured drive the first data channel 382.

The modem 300 may include a serializer 302 configured to convert n-bit parallel data elements, bytes or words into a serial data stream for transmission in a serialized data signal 322. The serialized data signal 322 may be preconditioned by a pre-equalizing circuit, such as the illustrated digital feed-forward equalizer (the FFE 304), in order to combat or compensate for signal distortions attributable to inter-symbol interference (ISI), reflection and other effects that can be expected to limit bandwidth in the first data channel 382. A preconditioned data signal 324 output by the FFE 304 is provided to a driver circuit 306 that is configured generate and transmit a differential transmit data signal 326 over the first data channel 382. For the purposes of this disclosure, a differential signal includes two complementary signals that are phase-shifted by 180° with respect to one another.

The wireless transceiver 340 can be configured to process a data signal 360 received over the first data channel 382. The data signal 360 may be provided to a differential receiver 342, which may include or cooperate with an equalizing circuit. In one example, continuous time linear equalization (CTLE) may be used to compensate for certain losses experienced in the first data channel 382. The first data channel 382 may be characterized in some respects as a low-pass filter. In the illustrated example, the differential receiver 342 outputs an equalized data signal 362 that is sampled by a slicer 344. The slicer 344 may be implemented using a D-flipflop or the like and may be configured to capture signaling state of the equalized data signal 362 under the control of edges in a sampling clock signal 372 generated by a clock and data recovery (CDR) circuit 348. The output of the slicer 344 may be provided to a deserializer 346 that is clocked in accordance with one or more clock signals provided by the CDR circuit 348. The CDR circuit 348 may be configured to delay or phase shift a receiver clock signal 370 to ensure that edges in the sampling clock signal 372 are timed to optimize sampling reliability.

In the illustrated wireless transceiver 340, the receiver clock signal 370 is derived from a received bus clock signal 374 from the clock channel 384. A differential receiver 352 coupled to the clock channel 384 may be configured to equalize the received bus clock signal 374, and a duty cycle correction circuit 350 may be used to adjust the duty cycle of the receiver clock signal 370. The receiver clock signal 370 is provided to a serializer 354 that is configured to convert n-bit parallel data elements, bytes or words into a serial data stream for transmission in a serialized data signal 364. The serialized data signal 364 may be preconditioned by a pre-equalizing circuit, such as the illustrated FFE 356, in order to combat or compensate for signal distortions attributable to ISI, reflection and other effects that can be expected to limit bandwidth in the second data channel 386. A preconditioned data signal 366 output by the FFE 356 is provided to a driver circuit 358 that is configured generate and transmit a differential transmit data signal 368 over the second data channel 386.

The illustrated modem 300 can be configured to process a data signal 332 received over the second data channel 386. The data signal 332 may be provided to a differential receiver 320, which may include or cooperate with an equalizing circuit. In one example, CTLE may be used to compensate for certain losses experienced in the second data channel 386. The second data channel 386 may be characterized in some respects as a low-pass filter. In the illustrated example, the differential receiver 320 outputs an equalized data signal 328 that is sampled by a slicer 318. The slicer 318 may be implemented using a D-flipflop or the like and may be configured to capture signaling state of the equalized data signal 328 under the control of edges in a sampling clock signal 334 generated by a CDR circuit 314. The output of the slicer 318 may be provided to a deserializer 316 that is clocked in accordance with one or more clock signals provided by the CDR circuit 314. The CDR circuit 314 may be configured to delay or phase shift a transmitter clock signal to ensure that edges in the sampling clock signal 334 are timed to optimize sampling reliability.

A clock generation circuit, including the illustrated phase locked loop 308, may generate multiple clock signals 336a, 336b, 336c used by the modem 300. One or more of the clock signals 336a, 336b, 336c may be a divided version of a base clock signal generated by the PLL 308. One or more of the clock signals 336a, 336b, 336c may be phase shifted with respect to the base clock signal. In one example, the serializer 302 may produce the serialized data signal 322 using timing provided by a first clock signal 336a. In another example, the bus clock signal 330 transmitted over the clock channel 384 may be derived from a second clock signal 336b. In some instances, a duty cycle correction circuit 310 may be used to adjust the duty cycle of the second clock signal 336b and to provide an input to a driver circuit 312 that is configured drive the clock channel 384. In another example, the CDR circuit 348 may generate the sampling clock signal 334 from a third clock signal 336c.

Limiting power consumption presents a major challenge in communication interfaces, including communication interfaces that include SERDES circuits. In mobile communication devices, reducing power consumption can increase battery life between charges. Accordingly, power consumption is a parameter that must be considered when physical layer (PHY) circuits are designed for communication interfaces that are required to meet ever-increasing demands for data rates and corresponding signaling rates associated with the communication interface.

Demands for higher data rates and increased performance from SERDES-based PHY circuits are, in part, a consequence of continual advances in process technology and changing industry and proprietary standards. Increased switching frequency of PHY circuits in communication interfaces require accurate clock signals that are used to serialize or deserialize a data stream. Clock signals transmitted over a communication link are subject to distortion, delays and skews that require phase correction, alignment and other adjustments to timing. As used herein, a clock conditioning circuit may be used for phase correction, signal equalization, signal alignment, reduction or removal of skew between complementary signals, duty cycle correction, other adjustments to frequency and timing of a clock signal. A device, such as the wireless transceiver 340 illustrated in FIG. 3, typically includes conditioning circuits to correct a variety of timing distortions associated with a clock signal that is received over a communication link to ensure accuracy of data capture from received data signals and to ensure the timing accuracy of data signals to be transmitted over the communication link.

In a typical serializer, for example, the clock input duty-cycle and skew between the complementary signals in a differential clock signal are critical to the timing accuracy of the serializer output. For the purposes of this disclosure, a differential signal includes two complementary signals that are phase-shifted by 180° with respect to one another. It is generally difficult for a designer to anticipate or quantify the large number of parameters that can affect the quality of a received clock signal and designers may be required to design complex receiver circuits and clock conditioning circuits, resulting in higher die area and power consumption. Examples of these clock conditioning circuits include duty cycle correction circuits, skew correction circuits and phase shifting circuits.

Figure 4:
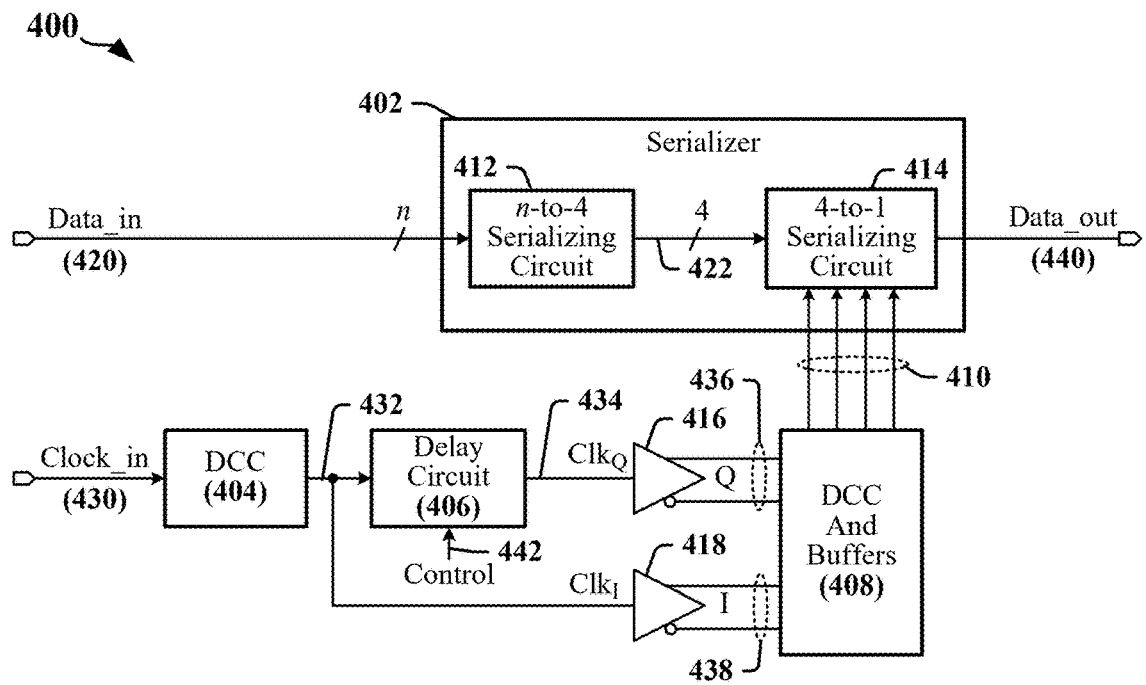
FIG. 4 illustrates an example of a conventional quarter-rate transmitter.
Figure 4:
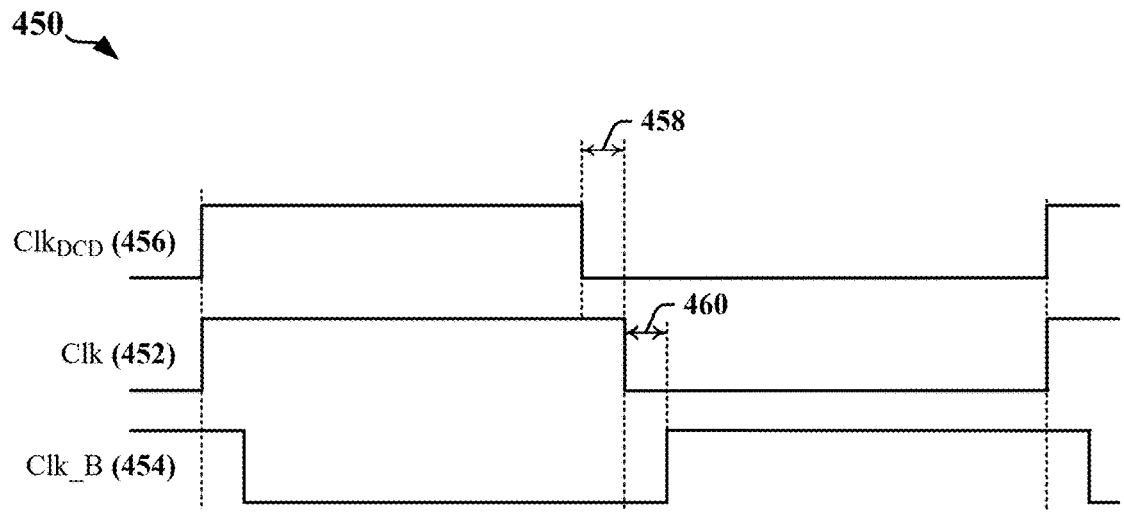

FIG. 4 illustrates an example of a quarter-rate transmitter 400. A quarter-rate transmitter may be sensitive to duty cycle error and clock skew. The quarter-rate transmitter 400 includes a serializer 402 that responds to edges provided in a multiphase clock signal 410 to provide a data output signal 440 that includes a serial bitstream. The serial bitstream is obtained by serializing a multibit data input 420. In the illustrated example, the multibit data input 420 is provided to a first serializing circuit 412 that receives a quantity (n) of bits and provides a 4-bit datastream 422 that includes a sequence of 4-bit units of data. In some implementations, the 4-bit datastream 422 may be generated using one or more multiplexers, one or more shift registers, or some combination of multiplexers and shift registers. In some implementations, the 4-bit datastream 422 may be received from registers written by a processor. The 4-bit datastream 422 is provided to a second serializing circuit 414 that provides the data output signal 440 according to timing provided by edges in the multiphase clock signal 410.

The multiphase clock signal 410 is derived from a quarter-rate input clock signal 430. In the illustrated example, the quarter-rate input clock signal 430 is provided to a duty cycle correction (DCC) circuit 404 that can be configured to ensure that the duration between rising edges and subsequent falling edges in a corrected clock signal 432 is substantially the same (i.e., within predefined tolerances) as the duration between falling edges and subsequent rising edges in the corrected clock signal 432. In some implementations, a divider circuit that provides the quarter-rate input clock signal 430 may be configured to ensure that the duty cycle of the quarter-rate input clock signal 430 lies within tolerances defined for the quarter-rate transmitter 400.

The corrected clock signal 432 may be provided to a buffer circuit 418 that outputs a differential in-phase clock signal 438. The corrected clock signal 432 is further provided to a delay circuit 406 that outputs a delayed clock signal 434. The delay circuit 406 can be configured by a control signal 442 to delay the corrected clock signal 432 by a duration the corresponds to 25% of the period of the quarter-rate input clock signal 430 in order to cause the delayed clock signal 434 to be phase-shifted by 90° with respect to the corrected input clock signal 432. The delayed clock signal 434 may be provided to a buffer circuit 416 that outputs a differential quadrature clock signal 436. In one example, the delay duration provided by the delay circuit 406 may be selected or adjusted using a coded value provided by the control signal 442. In another example, the control signal 442 may provide feedback that adjusts the delay duration provided by the delay circuit 406.

The differential in-phase clock signal 438 (I) and the differential quadrature clock signal 436 (Q) may be provided to conditioning circuits 408. The conditioning circuits 408 may include clock distribution drivers, buffers, additional DCC circuits and the like. The conditioning circuits 408 output the multiphase clock signal 410.

FIG. 4 includes a timing diagram 450 that illustrates duty cycle distortion in a clock signal (the $Clk_{DCD}$ signal 456) and skew between complementary signals (the Clk signal 452 and Clk_B signal 454) in a differential clock signal. For the purposes of this disclosure, duty cycle may be defined as the percentage or fraction of a clock cycle during which a signal is in an active state, or has a voltage greater than the mid-level of the voltage range in which the signal varies. The complementary signals in a differential signal can have different duty cycles. Duty cycle distortion can affect a single-ended clock or differential clock signals. In the illustrated example, the duty cycle of the digital $Clk_{DCD}$ signal 456 results in a difference 458 in duration between the active and inactive signaling states.

For the purposes of this disclosure, the terms "skew" and "clock skew" may be defined as the difference in time of arrival of related signals at respective inputs of a circuit. Skew may be caused by differences in propagation delays experienced by the related signals. Propagation delays may be caused by differences in physical path lengths or in communication channel impedances, by the deployment of different numbers of intervening circuits between the source and destination of the related signals, by jitter caused by noise or electromagnetic interference, and/or by differences introduced by variations in manufacturing processes, voltage or temperature (PVT). In the illustrated example, skew 460 is shown between the Clk signal 452 and Clk_B signal 454.

Figure 5:
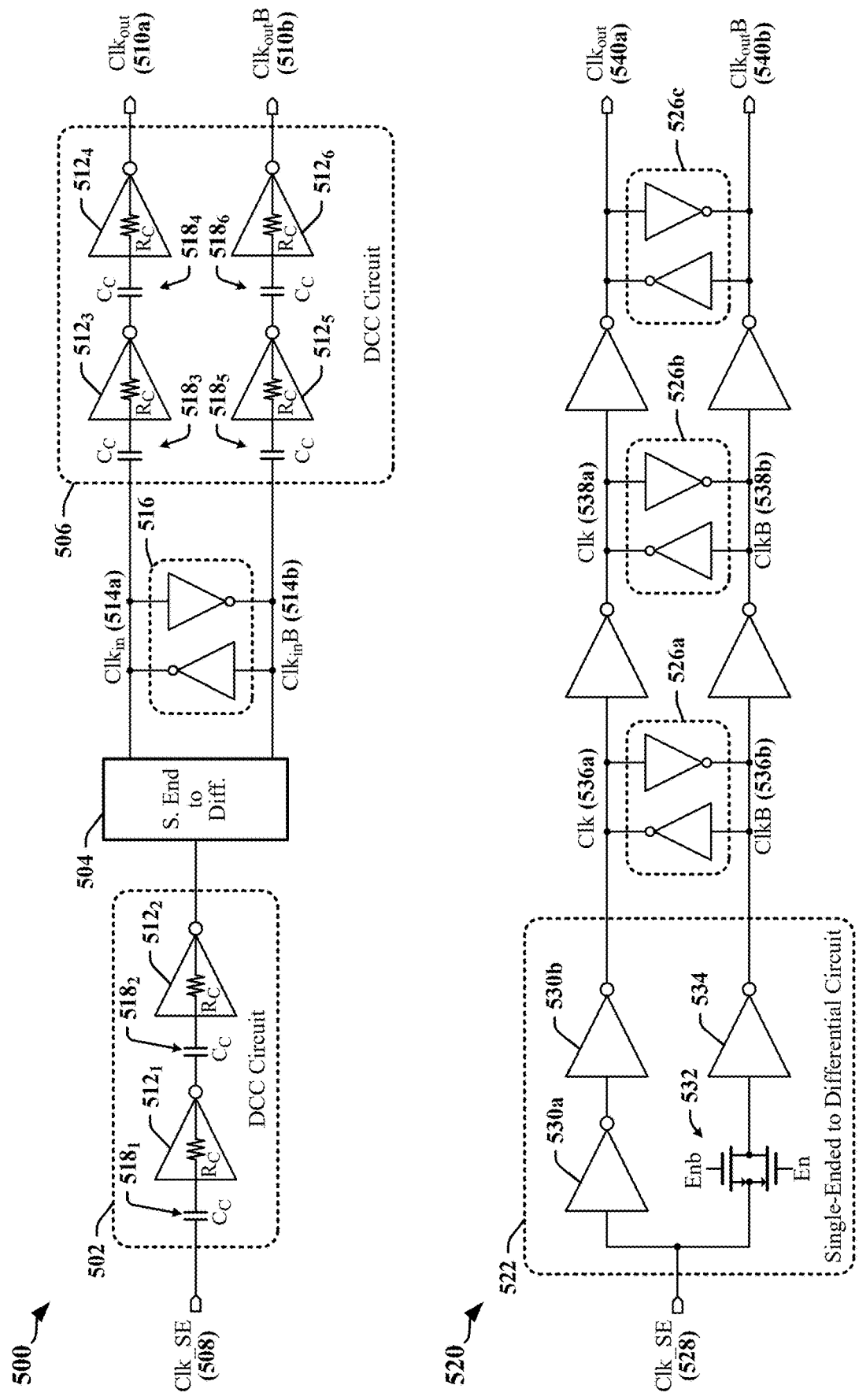
FIG. 5 illustrates examples of clock conditioning circuits.

FIG. 5 illustrates clock conditioning circuits 500, 520 that may be implemented in some systems. The clock conditioning circuit 500 represents a conservative design for duty cycle correction and includes a sufficient number of duty cycle correction stages to accommodate expected duty cycle distortion given a limited correction capability provided by each duty cycle correction stage. The number and configuration of the duty cycle correction stages may be selected to correct the expected worst case duty cycle distortion in an input clock signal and to compensate for duty cycle distortion introduced within the clock conditioning circuit 500.

The first clock conditioning circuit 500 receives a single-ended clock signal (Clk_SE 508) and outputs a differential clock signal that includes a pair of complementary output signals 510a, 510b. In the illustrated example, Clk_SE 508 is coupled to a single-ended to differential signal conversion circuit 504 through an input duty cycle correction circuit 502. The input duty cycle correction circuit 502 provides two stages of duty cycle correction. Each stage of the input duty cycle correction circuit 502 includes a capacitor $518_1$, $518_2$ and a self-biasing inverter $512_1$, $512_2$. Complementary clock skew that may be generated in the single-ended to differential signal conversion circuit 504 can be corrected using a skew correction circuit 516 that includes a pair of back-to-back inverters coupled in parallel between the complementary signals 514a, 514b output by the single-ended to differential signal conversion circuit 504. The input of each back-to-back inverter is coupled to the output of the other back-to-back inverter. A two-stage output duty cycle correction circuit 506 receives the complementary signals 514a, 514b output by the single-ended to differential signal conversion circuit 504 and drives the complementary output signals 510a, 510b. The duty cycle of a first complementary output signal 510a is corrected by a two-stage subcircuit in which each stage includes a capacitor $518_3$, $518_4$ and a self-biasing inverter $512_3$, $512_4$. The duty cycle of a second complementary output signal 510b is corrected by a two-stage subcircuit in which each stage includes a capacitor $518_5$, $518_6$ and a self-biasing inverter $512_5$, $512_6$.

The second clock conditioning circuit 520 represents a conservative design for clock skew correction. The second clock conditioning circuit 520 includes a sufficient number of skew correction stages to correct the expected worst-case skew between the complementary signals 514a, 514b. The number and configuration of the skew correction stages may be selected to correct the clock skew and reduce duty cycle distortion in an input clock signal.

The second clock conditioning circuit 520 receives a single-ended clock signal (Clk_SE 528) and outputs a differential clock signal that includes a pair of complementary output signals 540a, 540b. In the illustrated example, Clk_SE 528 is coupled to a single-ended to differential signal conversion circuit 522, which has a differential output that is coupled to three skew correction circuits 526a, 526b, 526c. In some implementations, a greater number of skew correction stages may be required. Each of the skew correction circuits 526a, 526b, 526c includes a pair of back-to-back inverters coupled in parallel between a corresponding pair complementary signals. In the illustrated example, the back-to-back inverters of a first skew correction circuit 526a is coupled between the complementary signals 536a, 536b output by the single-ended to differential signal conversion circuit 522, a second skew correction circuit 526b is coupled between the complementary signals 538a, 538b and a third skew correction circuit 526c is coupled between the complementary output signals 540a, 540b.

The illustrated single-ended to differential signal conversion circuit 522 provides two signal paths for Clk_SE 528. The first signal path is a non-inverting path that includes two series-connected inverters 530a, 530b. The second signal path is an inverting path that includes a single inverter 534 coupled in series with a pass gate circuit 532. The pass gate circuit 532 may be configured to help match delays in the two signal paths through the single-ended to differential signal conversion circuit 522.

The number of subcircuits and stages needed to implement the clock conditioning circuits 500, 520 illustrated in FIG. 5 requires the occupation of significant die real estate and can increase power consumption due to the number of circuits that switch at clock frequency.

Certain aspects of this disclosure relate to programmable clock conditioning circuits that can be used to improve clock duty cycle distortion correction without the need for calibration. Clock conditioning circuits provided in accordance with certain aspects of this disclosure can be implemented in transmitter and receivers used in communication links. Clock conditioning circuits provided in accordance with certain aspects of this disclosure can be used to reduce or eliminate duty cycle distortion and skew in clock signals that are used to control serializing or deserializing circuits in a communication interface.

Figure 6:
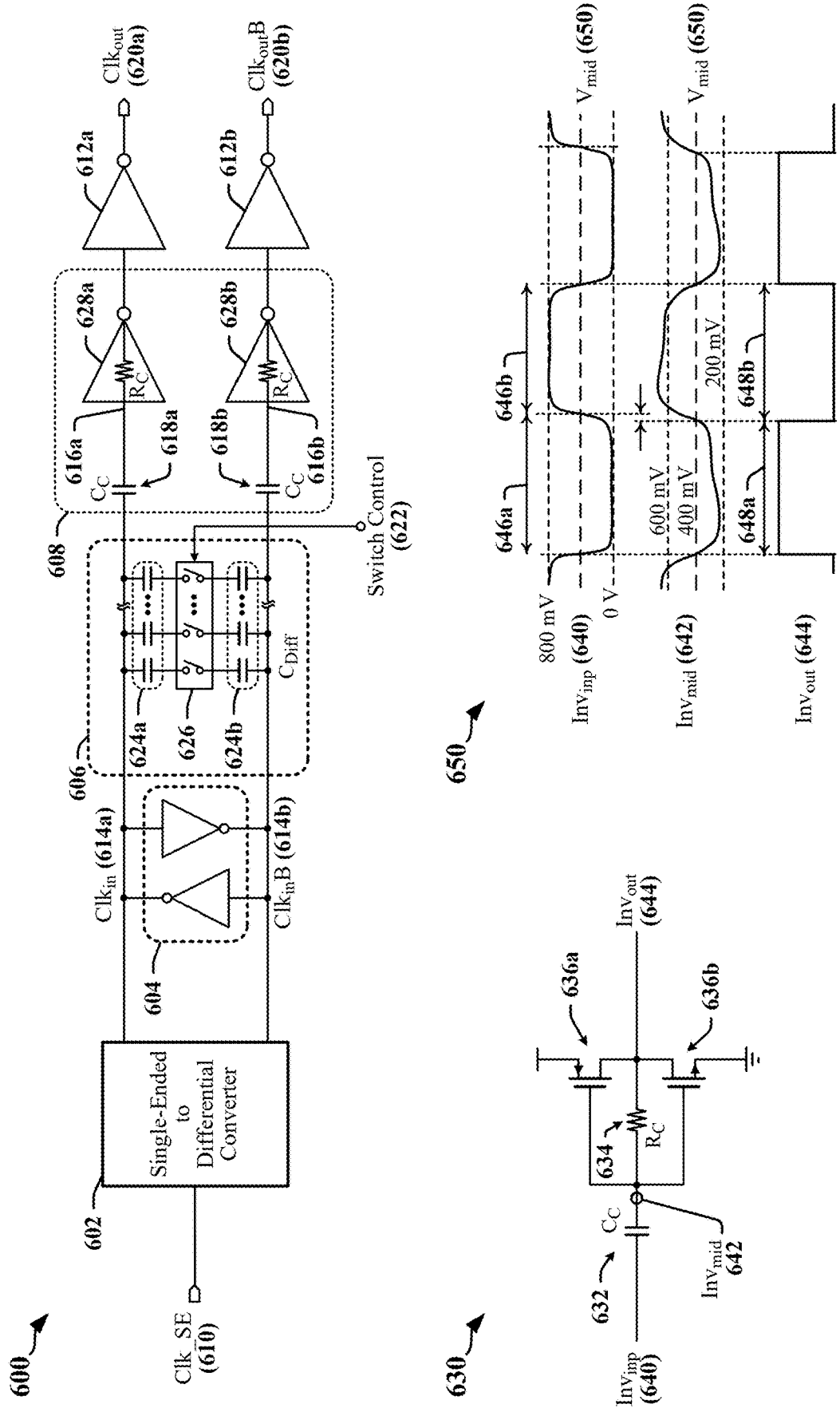
FIG. 6 illustrates certain aspects of a programmable clock conditioning circuit that has been configured in accordance with certain aspects of this disclosure.

FIG. 6 illustrates certain aspects of a programmable clock conditioning circuit 600 that has been configured in accordance with certain aspects of this disclosure. The programmable clock conditioning circuit 600 includes a skew correction circuit 604, a variable capacitor 606 and a duty cycle correction circuit 608. The programmable clock conditioning circuit 600 receives a single-ended input clock signal (Clk_SE signal 610) and outputs a differential clock signal that includes a pair of complementary output signals 620a, 620b. In the illustrated example, the Clk_SE signal 610 is coupled to a single-ended to differential signal conversion circuit 602. The skew correction circuit 604 includes a pair of back-to-back inverters coupled in parallel between the complementary signals 614a, 614b output by the single-ended to differential signal conversion circuit 602. The input of each back-to-back inverter is coupled to the output of the other back-to-back inverter. The duty cycle correction circuit 608 receives the complementary signals 620a, 620b and has a differential output that is coupled to a pair of inverters 612a, 612b. The inverters 612a, 612b provide the complementary output signals 620a, 620b.

The duty cycle correction circuit 608 is programmable. A first complementary signal 614a received from the single-ended to differential signal conversion circuit 602 is coupled through a first capacitor 618a to a first self-biasing inverter 628a. The second complementary signal 614b received from the single-ended to differential signal conversion circuit 602 is coupled through a second capacitor 618b to a second self-biasing inverter 628b. Capacitors 618a, 618b block the direct current (DC) component of their respective complementary signals 614a, 614b such that the signals received at the inputs 616a, 616b to the self-biasing inverters 628a, 628b are centered on a voltage level that is nominally the mid-point voltage level of the corresponding complementary signals 614a, 614b. A resistance provided in each of the self-biasing inverters 628a, 628b defines a resistance-capacitance (RC) constant that determines the rise time of edges in the signals passed through the capacitors 618a, 618b.

FIG. 6 includes an example of a self-biasing inverter 630 that may be used to implement the self-biasing inverters 628a, 628b in the programmable clock conditioning circuit 600. The self-biasing inverter 630 receives a single-ended input clock signal (the $Inv_{inp}$ signal 640) and provides a single-ended output clock signal (the $Inv_{out}$ signal 644). The self-biasing inverter 630 includes a pair of transistors 636a, 636b that are configured to operate as a push-pull amplifier that drives the $Inv_{out}$ signal 644. The $Inv_{inp}$ signal 640 is coupled to the gate of each of the pair of transistors 636a, 636b through an input capacitor 632. The DC component of the $Inv_{inp}$ signal 640 is blocked by the input capacitor 632 to provide a clock signal (the $Inv_{mid}$ signal 642) that is centered on the mid-level DC voltage of the $Inv_{inp}$ signal 640. A feedback resistor 634 is coupled between the $Inv_{out}$ signal 644 and the gates of the pair of transistors 636a, 636b. The feedback resistor 634 is configured to automatically bias the pair of transistors 636a, 636b.

The RC constant provided by the feedback resistor 634 and the input capacitor 632 is selected to provide a maximum transition time for signals in the $Inv_{mid}$ signal 642. The timing diagram 650 provides an example of the timing of signals associated with the self-biasing inverter 630. The $Inv_{inp}$ signal 640 is depicted as having relatively fast transitions between signaling states 646a, 646b. In the illustrated example, duty cycle is not at 50% as would be desired since the low signaling state 646a has a longer duration than the high signaling state 646b. The mid-level voltage of the $Inv_{mid}$ signal 642 rises above the mid-level voltage of the $Inv_{inp}$ signal 640 due to the imbalance of charge accumulation during the signaling states 646a, 646b.

The rise in the $Inv_{mid}$ signal 642 tends to drive the duty cycle of the $Inv_{out}$ signal 644 towards 50%, reflecting a more balanced charge accumulation between signaling states 646a, 646b. The raised voltage levels of the $Inv_{mid}$ signal 642 with respect to the $Inv_{inp}$ signal 640 changes the relationship of the $Inv_{mid}$ signal 642 with the switching thresholds used by the inverters 628a, 628b, and can therefore affect the point in time at which the inverters 628a, 628b switch during transitions between signaling states 646a, 646b.

The RC constant provided by the feedback resistor 634 and the input capacitor 632 effectively partially flattens the transitions in the $Inv_{mid}$ signal 642 between signaling states 646a, 646b. The slower transitions in the $Inv_{mid}$ signal 642 change the effective threshold of the inverters 628a, 628b and can amplify the effect of the raised voltage levels in the $Inv_{mid}$ signal 642. In the example illustrated by the timing diagram 650, the duty cycle distortion is almost completely corrected by the self-biasing inverter 630. The high signaling state 648a and the low signaling state 648b have durations that are close to nominal values for a 50% duty cycle.

The variable capacitor 606 in the programmable clock conditioning circuit 600 adds programmability to the duty cycle correction circuit 608 and can improve the effectiveness of the skew correction circuit 604 in addition to improving the effectiveness of the duty cycle correction circuit 608. The variable capacitor 606 can be configured to increase transition times between signaling states 646a, 646b of a clock signal and can facilitate the operation of the skew correction circuit 604 and the duty cycle correction circuit 608 when correcting skew and duty cycle errors in the complementary output signals 620a, 620b output by the single-ended to differential signal conversion circuit 602.

In the illustrated example, the variable capacitor 606 includes two sets of capacitors 624a, 624b coupled through a switch matrix 626. When activated, each switch in the switch matrix 626 is configured to couple the complementary signals 614a, 614b output by the single-ended to differential signal conversion circuit 602 through a series-connected combination of a capacitor in the first set of capacitors 624a and a corresponding capacitor in the second set of capacitors 624b. The switches in the switch matrix 626 are activated or deactivated by a switch control signal 622. In various examples, the switch control signal 622 encodes a multibit value using binary-weighted or unary encoding. Unary encoding, which may be referred to as thermometer encoding, represents data in the quantity of bits set to '1' that precede a terminating '0', or the quantity of bits set to '0' that precede a terminating '1'.

The skew and duty cycle corrections provided by the programmable clock conditioning circuit 600 can be increased by increasing the capacitance provided by the variable capacitor 606. Increasing the capacitance of the variable capacitor 606 tends to increase power consumption. However, such increased power consumption is offset by the overall reduced power consumption and reduced die area obtained through the use of single stage skew and duty cycle correction, with respect to conventional multi-stage duty cycle correction and skew correction circuits. The programmable clock conditioning circuit 600 can be implemented and operated without calibration.

Figure 7:
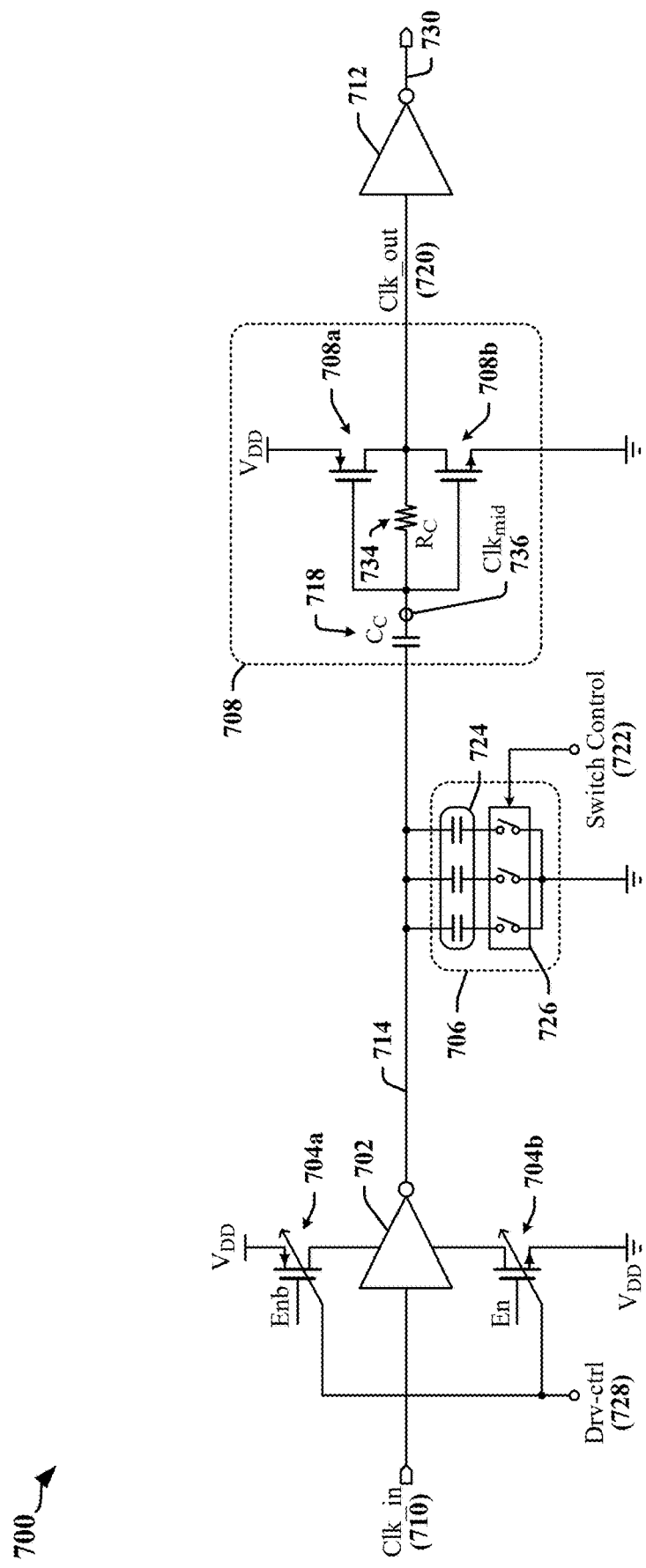
FIG. 7 illustrates certain aspects of a single-ended programmable clock conditioning circuit that has been configured in accordance with certain aspects of this disclosure.

FIG. 7 illustrates an example of a single-ended programmable clock conditioning circuit 700 that has been configured in accordance with certain aspects of this disclosure. The single-ended programmable clock conditioning circuit 700 receives a single-ended input clock signal (the Clk_in signal 710) and outputs a single-ended output clock signal 730. The single-ended programmable clock conditioning circuit 700 includes a configurable inverter 702, a variable capacitor 706 and a duty cycle correction circuit 708.

Certain output switching characteristics of the configurable inverter 702 may be configured, or controlled by adjusting the current supplied to the configurable inverter 702. In the illustrated example, current supply to the configurable inverter 702 is controlled using one or more PMOS transistors 704a to couple the configurable inverter 702 to the higher voltage power supply rail ($V_{DD}$) and one or more NMOS transistors 704b to couple the configurable inverter 702 to the lower voltage power supply rail (Ground). Current flow can be controlled by increasing the number of transistors 704a, 704b that actively couple the configurable inverter 702 to a power supply rail. In the illustrated example, the number of activated PMOS transistors 704a and activated NMOS transistors 704b is determined by an N-bit control code provided in a driver control signal 728.

Transitions in the Clk_in signal 710 may be slowed by an amount that is determined in part by the current levels provided to the configurable inverter 702. The delay applied to the Clk_in signal 710 may be controlled by adjusting the configuration of the transistors 704a, 704b. Transitions in the Clk_in signal 710 may be further slowed based on the RC constant associated with the variable capacitor 706 and a duty cycle correction circuit 708.

In the illustrated example, the duty cycle correction circuit 708 is implemented using the self-biasing inverter 630 illustrated in FIG. 6. The output (i.e., the Clk_out signal 720) of the duty cycle correction circuit 708 is provided to an inverter 712 that provides the single-ended output clock signal 730. The duty cycle correction circuit 708 is programmable. The delayed clock signal 714 output by the configurable inverter 702 is coupled to the gates of a pair of transistors 708a, 708b through an input capacitor 718. The DC component of the delayed clock signal 714 is blocked by the input capacitor 718 to provide a clock signal (the $Clk_{mid}$ signal 736) that is centered on the mid-level DC voltage of the delayed clock signal 714. A feedback resistor 734 is coupled between the Clk_out signal 720 and the gates of the pair of transistors 708a, 708b. The feedback resistor 734 is configured to automatically bias the pair of transistors 708a, 708b.

The RC constant provided by the feedback resistor 734 and the input capacitor 718 is selected to provide a maximum transition time for signals in the $Clk_{mid}$ signal 736. The mid-level voltage of the $Clk_{mid}$ signal 736 rises above the mid-level voltage of the delayed clock signal 714 due to the imbalance of charge accumulation during the different half cycles of the delayed clock signal 714. The rise in the $Clk_{mid}$ signal 736 tends to drive the duty cycle of the Clk_out signal 720 towards 50%, reflecting a more balanced charge accumulation between signaling states. The raised voltage levels of the $Clk_{mid}$ signal 736 with respect to the delayed clock signal 714 changes the relationship of the $Clk_{mid}$ signal 736 with the switching thresholds associated with the inverter 712, and can therefore affect the point in time at which the inverter 712 switches during transitions between signaling states.

The RC constant provided by the feedback resistor 734 and the input capacitor 718 effectively flattens the transitions in the $Clk_{mid}$ signal 736 between signaling states. The slower transitions in the $Clk_{mid}$ signal 736 change the effective switching threshold of the transistors 708a, 708b and can amplify the effect of the raised voltage levels in the $Clk_{mid}$ signal 736.

The variable capacitor 706 in the single-ended programmable clock conditioning circuit 700 adds programmability to the duty cycle correction circuit 708 and can improve the effectiveness of the duty cycle correction circuit 708. The variable capacitor 706 can be configured to reduce transition times between signaling states of a clock signal and can facilitate the operation of the duty cycle correction circuit 708.

In the illustrated example, the variable capacitor 706 includes a set of capacitors 724 coupled to a switch matrix 726. When activated, each switch in the switch matrix 726 is configured to couple the delayed clock signal 714 to ground through a corresponding capacitor in the set of capacitors 724. The switches in the switch matrix 726 are activated or deactivated by a switch control signal 722. In various examples, the switch control signal 722 encodes a multibit value using binary-weighted or unary encoding. In some instances, each switch in the switch matrix 726 can be configured to couple the delayed clock signal 714 to $V_{DD}$ through a corresponding capacitor in the set of capacitors 724 when activated.

The duty cycle correction provided by the single-ended programmable clock conditioning circuit 700 can be increased by increasing the capacitance provided by the variable capacitor 706. Increasing the capacitance of the variable capacitor 706 tends to increase power consumption. However, such increased power consumption is offset by the overall reduced power consumption and reduced die area obtained through the use of single stage duty cycle correction, and offer flexibility to save power and die area, with respect to conventional multi-stage duty cycle correction circuits. The single-ended programmable clock conditioning circuit 700 can be implemented and operated without calibration.

Figure 8:
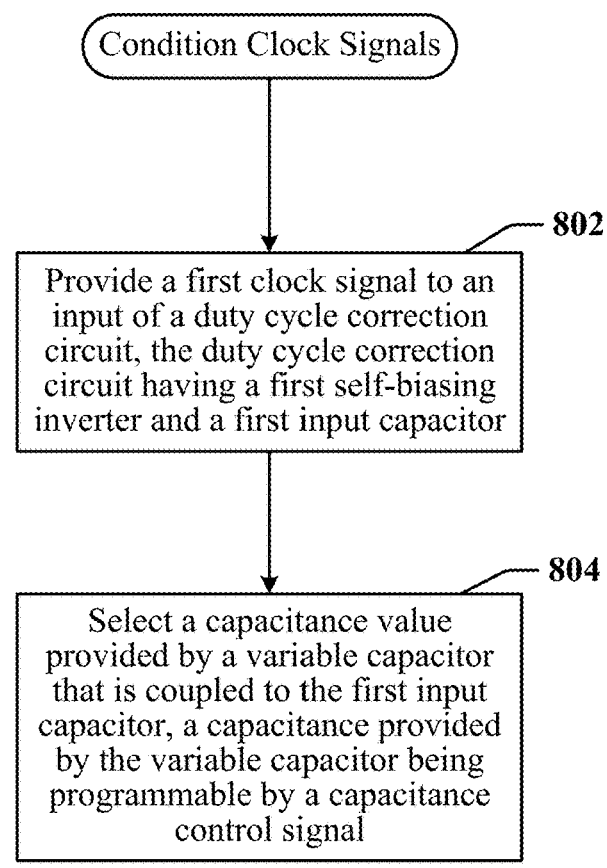
FIG. 8 is a flowchart of a method for generating clock signals in accordance with certain aspects of this disclosure.

FIG. 8 is a flowchart 8 of a method 800 for conditioning clock signals. In some examples, the method 800 may be implemented using the programmable clock conditioning circuit 600 illustrated in FIG. 6 or the single-ended programmable clock conditioning circuit 700 illustrated in FIG. 7.

At block 802 in the illustrated method, a first clock signal may be provided to an input of a duty cycle correction circuit, the duty cycle correction circuit having a first self-biasing inverter and a first input capacitor. At block 804 in the illustrated method, a capacitance value provided by a variable capacitor may be selected. The variable capacitor may be coupled to the first input capacitor. A capacitance provided by the variable capacitor may be programmable using a capacitance control signal. In one example, the variable capacitor may be coupled between the clock signal and a power supply rail. In another example, the variable capacitor may be coupled between complementary signals in a differential signal. The capacitance control signal may encode a multibit value used to select the capacitance provided by the variable capacitor. In one example, the capacitance control signal is a multi-bit unary or binary encoded signal.

In certain implementations, a second clock signal is provided to the duty cycle correction circuit. The duty cycle correction circuit may have a second self-biasing inverter and a second input capacitor, and the variable capacitor may be coupled between the first clock signal and the second clock signal. A single-ended input clock signal may be provided to an input circuit configured to convert the single-ended input clock signal to a differential clock signal. The differential clock signal may include the first clock signal and the second clock signal. The first clock signal and the second clock signal may be complementary signals. A skew correction circuit may be provided between the first clock signal and the second clock signal and may include at least one pair of back-to-back inverters. The input of each back-to-back inverter in a pair of back-to-back inverters is coupled to the output of the other back-to-back inverter in the pair of back-to-back inverters. The capacitance value provided by the variable capacitor may be selected by activating one or more switches controlled by the capacitance control signal. Each of the one or more switches may be configured to couple the first clock signal and the second clock signal through a corresponding pair of series connected differential capacitors when activated. In one example, a first differential capacitor is coupled between the first clock signal and a first terminal of a first switch and a second differential capacitor is coupled between the second clock signal and a second terminal of the first switch.

In some implementations, first self-biasing inverter has a feedback resistor that is coupled between the input of the first self-biasing inverter and an output of the first self-biasing inverter. In one example, the first self-biasing inverter is implemented using a push-pull amplifier in which the feedback resistor is coupled between the gates and the drains of the transistors in the push-pull amplifier.

In certain implementations, a configurable inverter provides the first clock signal by delaying an input clock signal. In some of these implementations, the variable capacitor is coupled between the first clock signal and ground. In these implementations, the capacitance value provided by the variable capacitor may be selected by activating one or more switches controlled by the capacitance control signal. Each of the one or more switches is configured to couple the first clock signal to ground through one of a plurality of capacitors provided in the variable capacitor when activated.

The method illustrated in FIG. 8 may be executed using a circuit provided in an IC device. In one example, the IC device comprises an SoC. In another example, the IC device is included in one of multiple semiconductor dice mounted on a substrate. The IC device may be implemented as a chiplet in some instances.

The IC device may include a bus interface. The bus interface may include a clock conditioning circuit that includes a duty cycle correction circuit. The duty cycle correction circuit may include a first input capacitor and a first self-biasing inverter having an input coupled to the first input capacitor. The duty cycle correction circuit may include a variable capacitor coupled to the first input capacitor. The variable capacitor may be configured to receive a first clock signal. A capacitance of the variable capacitor may be programmable by a capacitance control signal. In various examples, the capacitance control signal is a multi-bit unary or binary encoded signal.

In certain implementations, the duty cycle correction circuit includes a second input capacitor and a second self-biasing inverter. The second self-biasing inverter has an input coupled to the second clock signal through the second input capacitor. In these implementations, the variable capacitor is coupled between the first clock signal and the second clock signal. An input circuit and/or converter circuit may be configured to receive a single-ended input clock signal and to convert the single-ended input clock signal to a differential clock signal. The first clock signal and the second clock signal may be complementary signals provided in the differential clock signal. A skew correction circuit may be provided between the first clock signal and the second clock signal and may include at least one pair of back-to-back inverters. In some examples, the variable capacitor has a plurality of switches controlled by the capacitance control signal. Each activated switch may be configured to couple the first clock signal and the second clock signal through a corresponding pair of series connected differential capacitors.

In some implementations, first self-biasing inverter has a feedback resistor that is coupled between the input of the first self-biasing inverter and an output of the first self-biasing inverter. In one example, the first self-biasing inverter is implemented using a push-pull amplifier in which the feedback resistor is coupled between the gates and the drains of the transistors in the push-pull amplifier.

In certain implementations, the clock conditioning circuit includes a configurable inverter that is configured to provide the first clock signal by delaying an input clock signal. In these implementations, the variable capacitor may be coupled between the first clock signal and ground. In one example, the variable capacitor includes a plurality of switches controlled by the capacitance control signal. Each switch is configured to couple the first clock signal to ground through one of a plurality of capacitors provided in the variable capacitor when the switch is activated.

Some implementation examples are described in the following numbered clauses:

1. A clock conditioning circuit, comprising: a duty cycle correction circuit, including a first input capacitor, and a first self-biasing inverter having an input coupled to the first input capacitor; and a variable capacitor coupled to the first input capacitor, the variable capacitor configured to receive a first clock signal, a capacitance of the variable capacitor being programmable by a capacitance control signal.
2. The clock conditioning circuit as described in clause 1, wherein the duty cycle correction circuit comprises: a second input capacitor; and a second self-biasing inverter having an input coupled to a second clock signal through the second input capacitor, wherein the variable capacitor is coupled between the first clock signal and the second clock signal.
3. The clock conditioning circuit as described in clause 2, further comprising: an input circuit configured to receive a single-ended input clock signal and to convert the single-ended input clock signal to a differential clock signal that comprises the first clock signal and the second clock signal; and a skew correction circuit comprising at least one pair of back-to-back inverters coupled between the first clock signal and the second clock signal.
4. The clock conditioning circuit as described in clause 2, or clause 3 wherein the variable capacitor comprises: a plurality of switches controlled by the capacitance control signal, wherein each switch is configured to couple the first clock signal and the second clock signal through a corresponding pair of series connected differential capacitors when activated.
5. The clock conditioning circuit as described in any of clauses 1-4, wherein the capacitance control signal comprises a multi-bit unary or binary encoded signal.
6. The clock conditioning circuit as described in any of clauses 1-5, wherein the first self-biasing inverter comprises a feedback resistor coupled between the input of the first self-biasing inverter and an output of the first self-biasing inverter.
7. The clock conditioning circuit as described in clause 1, further comprising: a configurable inverter configured to provide the first clock signal by delaying an input clock signal, wherein the variable capacitor is coupled between the first clock signal and ground.
8. The clock conditioning circuit as described in clause 7, wherein the variable capacitor comprises: a plurality of switches controlled by the capacitance control signal, wherein each switch is configured to couple the first clock signal to ground through one of a plurality of capacitors provided in the variable capacitor when the each switch is activated.
9. A method for conditioning clock signals, comprising: providing a first clock signal to an input of a duty cycle correction circuit, the duty cycle correction circuit having a first self-biasing inverter and a first input capacitor; and selecting a capacitance value provided by a variable capacitor that is coupled to the first input capacitor, a capacitance provided by the variable capacitor being programmable by a capacitance control signal.
10. The method as described in clause 9, further comprising: providing a second clock signal to the duty cycle correction circuit wherein the duty cycle correction circuit comprises a second self-biasing inverter and a second input capacitor, wherein the variable capacitor is coupled between the first clock signal and the second clock signal.
11. The method as described in clause 10, further comprising: providing a single-ended input clock signal to an input circuit configured to convert the single-ended input clock signal to a differential clock signal that comprises the first clock signal and the second clock signal; and correcting skew between the first clock signal and the second clock signal using at least one pair of back-to-back inverters coupled between the first clock signal and the second clock signal.
12. The method as described in clause 10 or clause 11, wherein selecting the capacitance value provided by the variable capacitor comprises: activating one or more switches controlled by the capacitance control signal, wherein each of the one or more switches is configured to couple the first clock signal and the second clock signal through a corresponding pair of series connected differential capacitors when activated.
13. The method as described in any of clauses 9-12, wherein the capacitance control signal comprises a multi-bit unary or binary encoded signal.
14. The method as described in any of clauses 9-13, wherein the first self-biasing inverter comprises a feedback resistor coupled between the input of the first self-biasing inverter and an output of the first self-biasing inverter.
15. The method as described in clause 9, further comprising: causing a configurable inverter to provide the first clock signal by delaying an input clock signal, wherein the variable capacitor is coupled between the first clock signal and ground.
16. The method as described in clause 15, wherein selecting the capacitance value provided by the variable capacitor comprises: activating one or more switches controlled by the capacitance control signal, wherein each of the one or more switches is configured to couple the first clock signal to ground through one of a plurality of capacitors provided in the variable capacitor when activated.
17. An apparatus, comprising: means for correcting a duty cycle of a clock signal, including a first self-biasing inverter and a first input capacitor; means for adjusting transition times of edges in the clock signal, including a variable capacitor that is coupled to the first input capacitor; and means for programming a capacitance value provided by a variable capacitor, the means for programming the capacitance value being responsive to a capacitance control signal.
18. The apparatus as described in clause 17, wherein the means for correcting the duty cycle of the first clock signal includes: a second self-biasing inverter and a second input capacitor, wherein the variable capacitor is coupled between the first input capacitor and the second input capacitor.
19. The apparatus as described in clause 18, wherein the means for correcting the duty cycle of the first clock signal includes: an input circuit configured to receive a single-ended input clock signal and to convert the single-ended input clock signal to a differential clock signal that comprises a first complementary signal and the second complementary signal; and a skew correction circuit comprising at least one pair of back-to-back inverters coupled between the first complementary signal and the second complementary signal.

20. The apparatus as described in clause 17, wherein the means for correcting the duty cycle of the first clock signal includes: a configurable inverter configured to couple the clock signal to the first input capacitor and further configured to delay the clock signal, and wherein the variable capacitor is coupled between the clock signal and ground.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A clock conditioning circuit, comprising:
    a duty cycle correction circuit, including
        a first input capacitor, and
        a first self-biasing inverter having an input coupled to the first input capacitor; and
    a variable capacitor coupled to the first input capacitor, the variable capacitor configured to receive a first clock signal, a capacitance of the variable capacitor being programmable by a capacitance control signal.

2. The clock conditioning circuit of claim 1, wherein the duty cycle correction circuit comprises:
    a second input capacitor; and
    a second self-biasing inverter having an input coupled to a second clock signal through the second input capacitor,
    wherein the variable capacitor is coupled between the first clock signal and the second clock signal.

3. The clock conditioning circuit of claim 2, further comprising:
    an input circuit configured to receive a single-ended input clock signal and to convert the single-ended input clock signal to a differential clock signal that comprises the first clock signal and the second clock signal; and
    a skew correction circuit comprising at least one pair of back-to-back inverters coupled between the first clock signal and the second clock signal.

4. The clock conditioning circuit of claim 2, wherein the variable capacitor comprises:
    a plurality of switches controlled by the capacitance control signal, wherein each switch is configured to couple the first clock signal and the second clock signal through a corresponding pair of series connected differential capacitors when activated.

5. The clock conditioning circuit of claim 1, wherein the capacitance control signal comprises a multi-bit unary or binary encoded signal.

6. The clock conditioning circuit of claim 1, wherein the first self-biasing inverter comprises a feedback resistor coupled between the input of the first self-biasing inverter and an output of the first self-biasing inverter.

7. The clock conditioning circuit of claim 1, further comprising:
    a configurable inverter configured to provide the first clock signal by delaying an input clock signal, wherein the variable capacitor is coupled between the first clock signal and ground.

8. The clock conditioning circuit of claim 7, wherein the variable capacitor comprises:
    a plurality of switches controlled by the capacitance control signal, wherein each switch is configured to couple the first clock signal to ground through one of a plurality of capacitors provided in the variable capacitor when the each switch is activated.

9. A method for conditioning clock signals, comprising:
    providing a first clock signal to an input of a duty cycle correction circuit, the duty cycle correction circuit having a first self-biasing inverter and a first input capacitor; and
    selecting a capacitance value provided by a variable capacitor that is coupled to the first input capacitor, a capacitance provided by the variable capacitor being programmable by a capacitance control signal.

10. The method of claim 9, further comprising:
    providing a second clock signal to the duty cycle correction circuit wherein the duty cycle correction circuit comprises a second self-biasing inverter and a second input capacitor, wherein the variable capacitor is coupled between the first clock signal and the second clock signal.

11. The method of claim 10, further comprising:
    providing a single-ended input clock signal to an input circuit configured to convert the single-ended input clock signal to a differential clock signal that comprises the first clock signal and the second clock signal; and
    correcting skew between the first clock signal and the second clock signal using at least one pair of back-to-back inverters coupled between the first clock signal and the second clock signal.

12. The method of claim 10, wherein selecting the capacitance value provided by the variable capacitor comprises:
    activating one or more switches controlled by the capacitance control signal, wherein each of the one or more switches is configured to couple the first clock signal and the second clock signal through a corresponding pair of series connected differential capacitors when activated.

13. The method of claim 9, wherein the capacitance control signal comprises a multi-bit unary or binary encoded signal.

14. The method of claim 9, wherein the first self-biasing inverter comprises a feedback resistor coupled between the input of the first self-biasing inverter and an output of the first self-biasing inverter.

15. The method of claim 9, further comprising:
causing a configurable inverter to provide the first clock signal by delaying an input clock signal, wherein the variable capacitor is coupled between the first clock signal and ground.

16. The method of claim 15, wherein selecting the capacitance value provided by the variable capacitor comprises:
activating one or more switches controlled by the capacitance control signal, wherein each of the one or more switches is configured to couple the first clock signal to ground through one of a plurality of capacitors provided in the variable capacitor when activated.

17. An apparatus, comprising:
means for correcting a duty cycle of a clock signal, including a first self-biasing inverter and a first input capacitor;
means for adjusting transition times of edges in the clock signal, including a variable capacitor that is coupled to the first input capacitor; and
means for programming a capacitance value provided by a variable capacitor, the means for programming the capacitance value being responsive to a capacitance control signal,
wherein the means for correcting the duty cycle of the clock signal includes:
a second self-biasing inverter and a second input capacitor, wherein the variable capacitor is coupled between the first input capacitor and the second input capacitor.

18. The apparatus of claim 17, wherein the means for correcting the duty cycle of the clock signal includes:
an input circuit configured to receive a single-ended input clock signal and to convert the single-ended input clock signal to a differential clock signal that comprises a first complementary signal and a second complementary signal; and
a skew correction circuit comprising at least one pair of back-to-back inverters coupled between the first complementary signal and the second complementary signal.

19. An apparatus, comprising:
means for correcting a duty cycle of a clock signal, including a first self-biasing inverter and a first input capacitor;
means for adjusting transition times of edges in the clock signal, including a variable capacitor that is coupled to the first input capacitor; and
means for programming a capacitance value provided by a variable capacitor, the means for programming the capacitance value being responsive to a capacitance control signal
wherein the means for correcting the duty cycle of the clock signal includes:
a configurable inverter configured to couple the clock signal to the first input capacitor and further configured to delay the clock signal, and wherein the variable capacitor is coupled between the clock signal and ground.

* * * * *